United States Patent
Tekleab et al.

(10) Patent No.: US 9,595,555 B2
(45) Date of Patent: Mar. 14, 2017

(54) PIXEL ISOLATION REGIONS FORMED WITH CONDUCTIVE LAYERS

(71) Applicant: SEMICONDUCTOR COMPONENTS INDUSTRIES, LLC, Phoenix, AZ (US)

(72) Inventors: Daniel Tekleab, Hayward, CA (US); Giovanni De Amicis, L'Aguila (IT)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 15 days.

(21) Appl. No.: 14/702,883

(22) Filed: May 4, 2015

(65) Prior Publication Data
US 2016/0329365 A1 Nov. 10, 2016

(51) Int. Cl.
*H01L 27/146* (2006.01)
*H04N 5/374* (2011.01)

(52) U.S. Cl.
CPC .... *H01L 27/1463* (2013.01); *H01L 27/14603* (2013.01); *H01L 27/14612* (2013.01); *H01L 27/14621* (2013.01); *H01L 27/14641* (2013.01); *H01L 27/14689* (2013.01); *H04N 5/374* (2013.01)

(58) Field of Classification Search
CPC .......... H01L 27/1463; H01L 27/14636; H01L 27/14687; H04N 5/374
See application file for complete search history.

(56) References Cited

U.S. PATENT DOCUMENTS

| 5,008,758 | A | 4/1991 | Burke |
| 7,662,657 | B2 | 2/2010 | Mouli |
| 8,390,089 | B2 | 3/2013 | Chen et al. |
| 8,471,312 | B2* | 6/2013 | Kudoh ............. H01L 27/14603 257/292 |
| 8,872,953 | B2* | 10/2014 | Sakano ............. H01L 27/14609 348/308 |
| 8,946,611 | B2* | 2/2015 | Iwata ................ H01L 27/14603 250/208.1 |
| 9,160,949 | B2* | 10/2015 | Zhang .................... H04N 5/361 |
| 2005/0184353 | A1* | 8/2005 | Mouli ................. H01L 27/1463 257/446 |
| 2006/0180885 | A1 | 8/2006 | Rhodes | |

(Continued)

OTHER PUBLICATIONS

Tekleab, U.S. Appl. No. 14/543,793, filed Nov. 17, 2014.

*Primary Examiner* — Nicholas Giles
(74) *Attorney, Agent, or Firm* — Treyz Law Group, P.C.; Joshua F. Guihan

(57) ABSTRACT

An image sensor may include isolation regions that are formed in between photodiodes. These isolation regions may prevent cross-talk and improve the performance of the image sensor. The isolation regions may include a conductive layer that is electrically connected to a bias voltage supply line. Biasing the conductive layer may result in a charge inversion in the substrate adjacent to the conductive layer. The charge inversion may prevent the generation of dark current. The conductive layer may be formed on a liner oxide layer in trenches formed in epitaxial silicon. A connecting layer may be used to electrically connect each conductive layer. The connecting layer may be formed integrally with the conductive layer or formed from a separate material.

18 Claims, 5 Drawing Sheets

(56) References Cited

U.S. PATENT DOCUMENTS

| | | | |
|---|---|---|---|
| 2009/0140304 A1* | 6/2009 | Kudoh | H01L 27/14603 257/292 |
| 2011/0147884 A1* | 6/2011 | Van Noort | H01L 21/743 257/508 |
| 2012/0025060 A1* | 2/2012 | Iwata | H01L 27/14603 250/208.1 |
| 2013/0049082 A1* | 2/2013 | Kato | H04N 5/3745 257/292 |
| 2013/0308008 A1* | 11/2013 | Funatsu | H01L 27/14609 348/222.1 |
| 2014/0246707 A1* | 9/2014 | Koo | H01L 27/14614 257/230 |
| 2014/0291481 A1* | 10/2014 | Zhang | H04N 5/361 250/208.1 |
| 2016/0104730 A1* | 4/2016 | Ahmed | H01L 27/1463 438/80 |
| 2016/0190200 A1* | 6/2016 | Shinohara | H01L 27/14623 257/292 |

\* cited by examiner

PIXEL ISOLATION REGIONS FORMED WITH CONDUCTIVE LAYERS

BACKGROUND

The present invention relates to integrated circuits and, more particularly, to forming isolation regions in CMOS (complementary metal oxide semiconductor) image sensors.

Digital cameras are often provided with digital image sensors such as CMOS image sensors. Digital cameras may be stand-alone devices or may be included in electronic devices such as cellular telephones or computers. A typical CMOS image sensor has an image sensor pixel array containing thousands or millions of pixels. Each pixel includes a photosensitive element such as a photodiode formed in a substrate. Isolation regions may be formed in the substrate between photodiodes to reduce crosstalk between photodiodes.

To improve image quality, it is often desirable to increase the number and density of pixels on an image sensor. As pixel density increases, pixels necessarily are pushed closer and closer together, increasing the likelihood of cross-talk. Isolation regions help alleviate cross-talk and allow the photodiodes to have a greater full well capacity and therefore an improved image quality.

Conventional methods for forming isolation regions include ion implantation. However, implanted ions are difficult to precisely control and often diffuse laterally, making it impossible to produce an abrupt junction. Consequently, full well capacity must be sacrificed in order to provide sufficient isolation between photodiodes. Alternatively, deep trench isolation methods may be used in which a liner oxide is grown in an isolation trench. However, this method introduces defects due to lattice mismatch, thus resulting in higher dark current. Dark current refers to the current that is spontaneously generated even when a pixel is not exposed to light. The increase in dark current resulting from a liner oxide in an isolation trench can result in undesirable noise or hot pixels in the image sensor.

It would therefore be desirable to be able to provide improved methods for forming isolation regions in image sensors.

DETAILED DESCRIPTION

Figure 1:
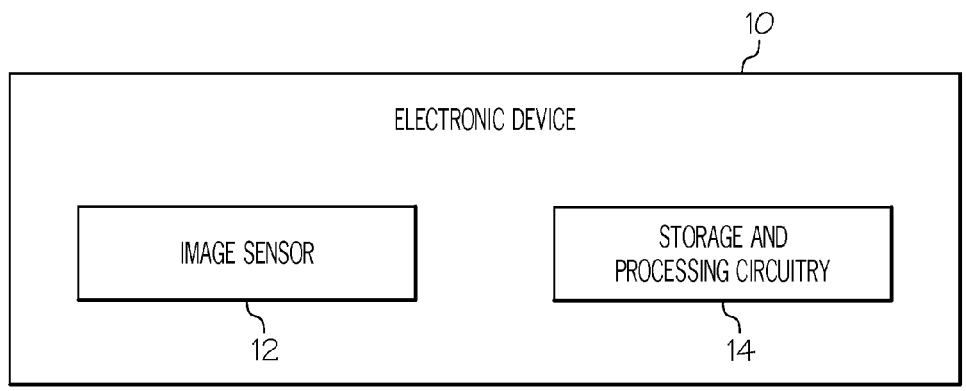
FIG. 1 is a diagram of an illustrative electronic device having an image sensor in accordance with an embodiment of the present invention.

Digital image sensors are widely used in digital cameras and in electronic devices such as cellular telephones, computers, and computer accessories. An illustrative electronic device 10 with an image sensor 12 and storage and processing circuitry 14 is shown in FIG. 1. Electronic device 10 may be a digital camera, a computer, a computer accessory, a cellular telephone, or other electronic device. Image sensor 12 may be part of a camera module that includes a lens or may be provided in an electronic device that has a separate lens. During operation, the lens focuses light onto image sensor 12. Image sensor 12 may have an array of image sensor pixels containing photosensitive elements such as photodiodes that convert light into digital data. Image sensors may have any number of pixels (e.g., hundreds, thousands, millions, or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage in circuitry 14. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc. If desired, image sensor 12 and processing circuitry 14 may be implemented using a single integrated circuit or may be implemented using separate integrated circuits.

Figure 2:
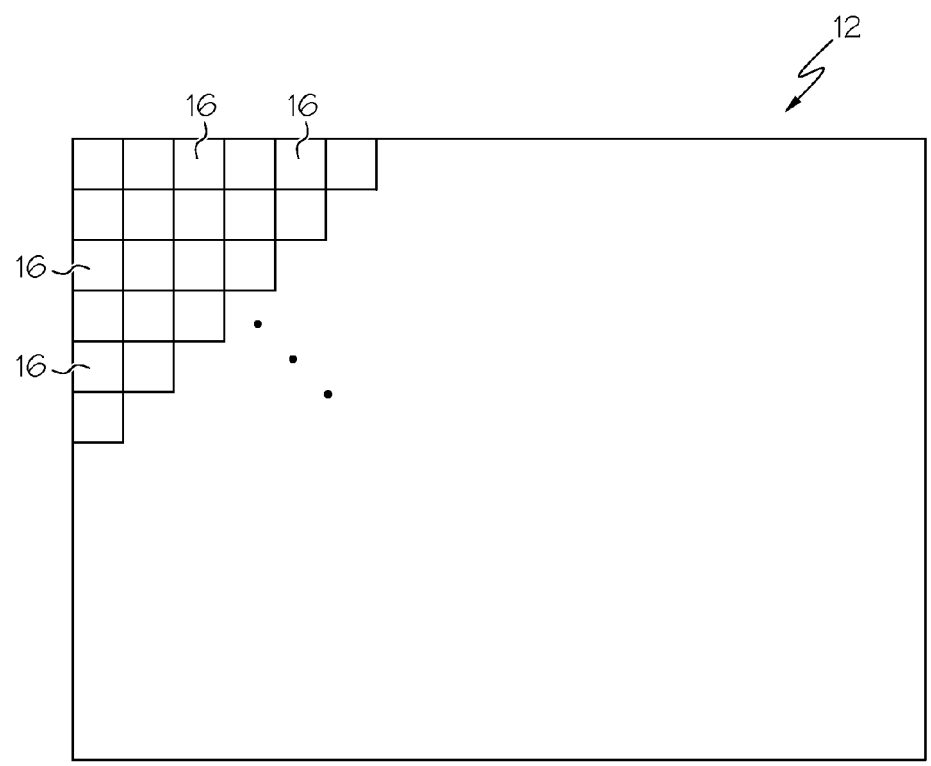
FIG. 2 is a top view of an illustrative image sensor pixel array in accordance with an embodiment of the present invention.

An illustrative image sensor pixel array 12 is shown in FIG. 2. Image sensor 12 of FIG. 2 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals).

Figure 3:
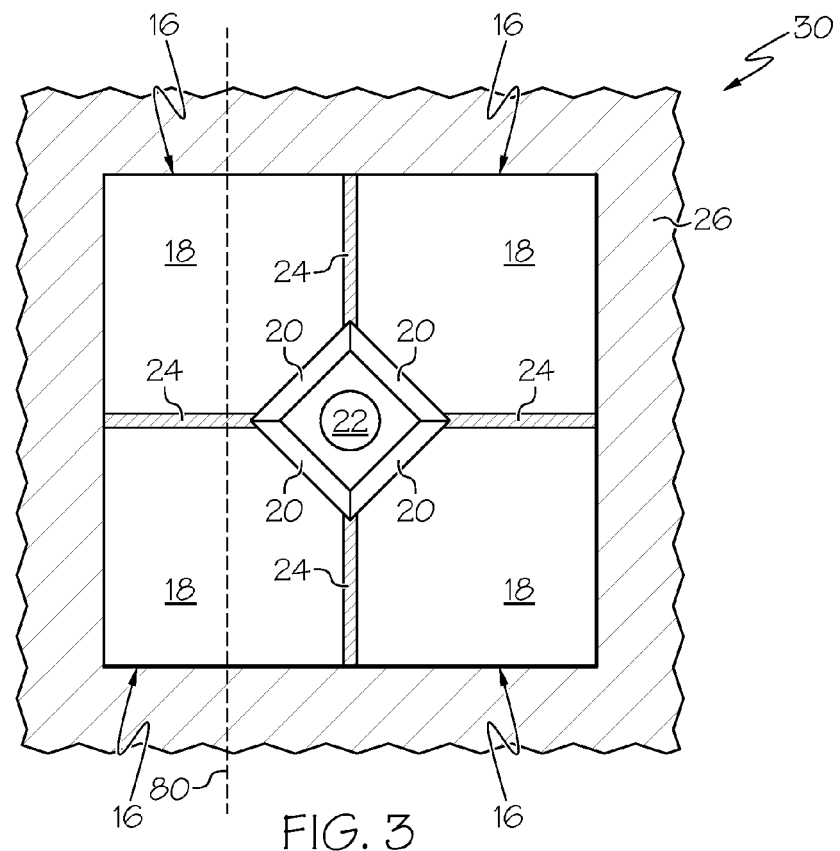
FIG. 3 is a top view of a portion of an illustrative image sensor pixel array having isolation structures in accordance with an embodiment of the present invention.

FIG. 3 is a diagram showing a portion of an array of image sensor pixels 16. In the example of FIG. 3, each pixel 16 has a photodiode 18. Photodiodes 18 may be formed in substrate 30. Photons may strike photodiodes 18 and generate charge. Charge can be transferred to floating diffusion region 22 by turning transfer gates 20 momentarily on. Photodiodes 18 within pixel 16 may be separated by isolation regions 24. Isolation region 26 may separate photodiodes 18 from array transistors and from adjacent pixels.

If desired, each pixel 16 may include a separate floating diffusion node. The example of FIG. 3 in which four pixels 16 share floating diffusion node 22 is merely illustrative.

Substrate 30 may be a silicon substrate. Substrate 30 may, for example, be a doped substrate such as a p-type substrate or a p+ substrate. Substrate 30 may have an epitaxial layer such as a p-type or n-type epitaxial layer. If desired, substrate 30 may be a silicon-on-insulator (SOI) substrate and may have a buried oxide layer (BOX).

Figure 4:
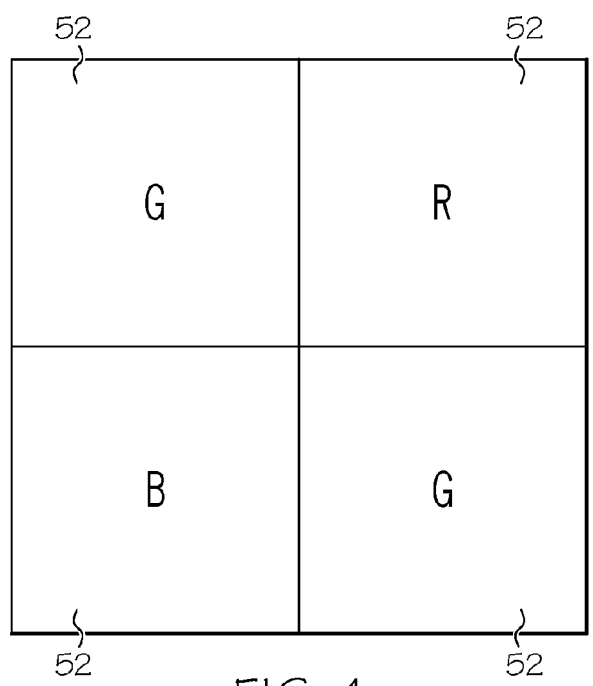
FIG. 4 is a top view of illustrative color filter elements that may be used in an image sensor pixel array in accordance with an embodiment of the present invention.

Incoming light may pass through a color filter before striking one of photodiodes 18 of FIG. 3. FIG. 4 is a top view of illustrative color filter elements that may filter light for pixels 16 of FIG. 3. The color filter pattern of FIG. 4 has red (R), green (G), and blue (B) color filter elements 52 and is sometimes referred to as a Bayer pattern. The pattern of FIG. 4 is merely illustrative, however. If desired, other patterns and/or other filter elements (e.g., filter elements having different spectral responses) may be used.

The quality of the images captured using image sensor 12 may be influenced by a variety of factors. For example, the size of the pixel array in image sensor 12 may have an impact on image quality. Large image sensors with large numbers of image pixels will generally be able to produce images with higher quality or resolution than smaller image sensors having fewer image pixels. Additionally, the full well capacity of photodiodes 18 in image sensor 12 may have an impact on image quality. Full well capacity is a measure of the amount of charge an individual pixel can hold before becoming saturated. Pixels becoming saturated may decrease the quality of an image. Therefore, it is desirable for a pixel to be able to hold as much charge as possible so that the pixel becomes saturated less often.

In order to increase the number of pixels and improve image quality, it may be desirable to decrease the size of the pixels. It also may be desirable to decrease the pixel pitch of an image sensor, which is a measure of the distance between equivalent pixels. For example, pixel pitches for image sensors may be 10 microns or less, 5 microns or less, one micron or less, etc.

As pixel pitch is reduced, cross-talk between pixels is more likely as neighboring photodiodes become closer together. In order to increase the number of pixels while still preventing cross-talk, full well capacity has to be sacrificed, as neighboring photodiodes with greater full well capacity will be more susceptible to cross-talk. Consequently, full well capacity is reduced to achieve maximum pixel density.

It may be desirable to increase the number of pixels while preventing cross-talk without sacrificing full well capacity. Formation of improved isolation regions such as isolation regions 24 of FIG. 3 may enable an improved pixel array with minimal cross-talk and maximum full-well capacity.

Figure 5:
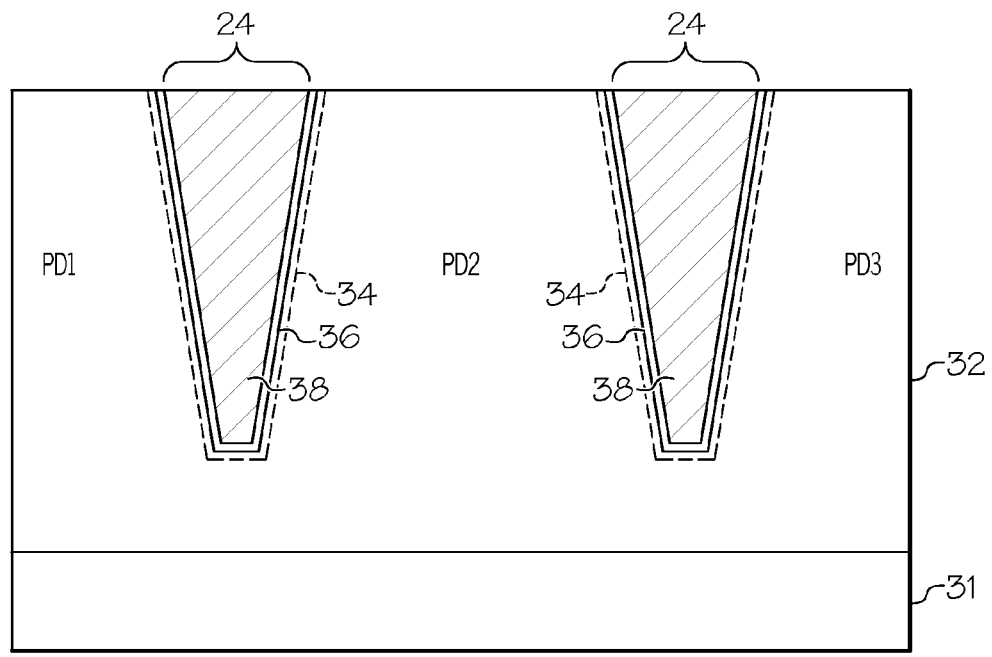
FIG. 5 is a cross-sectional side view of an illustrative image sensor with a conductive layer formed in each isolation region in accordance with an embodiment of the present invention.

FIG. 5 is a cross-sectional side view of a portion of an image sensor with a conductive gate formed in each isolation region. Epitaxial layer 32 may be a p-type layer or n-type layer deposited on an upper surface of substrate layer 31. Substrate 31 may be a p+ or p-type silicon substrate or a buried oxide (BOX) layer. Substrate 31 may include transfer transistors, reset transistors, and source-follower transistors. Epitaxial layer 32 may, for example, be a p-type epitaxial layer that is doped with boron or other suitable dopants. Epitaxial layer 32 may be doped with boron or other suitable dopants at densities of $10^{14}$-$10^{15}$ cm$^{-3}$ or other suitable densities. Photodiodes may be formed in epitaxial layer 32. FIG. 5 shows three photodiodes (PD1, PD2, and PD3). Each photodiode may be surrounded by isolation regions 24. Each isolation region 24 may include liner 36. Liner 36 may be made of an oxide. Liner oxide 36 may completely cover the isolation region 24 such that liner oxide 36 is in direct contact with epitaxial layer 32. The liner oxide may have any suitable thickness. In various embodiments, the liner oxide layer may be less than 1 μm, less than 0.1 μm, less than 0.01 μm, between 0.01 μm and 0.001 μm, or less than 0.001 μm.

The interface of liner oxide 36 and epitaxial layer 32 may have a lattice mismatch with the potential to produce high amounts of dark current. To prevent the production of dark current, isolation region 24 may include conductive gate 38. The conductive gate may be electrically connected to a bias voltage. Biasing the conductive gate results in a charge inversion adjacent to the surface of the conductive gate. The area with the charge inversion is shown by dashed line 34. The portion of the substrate between dashed line 34 and liner 36 may experience the charge inversion when the conductive gate is electrically connected to a bias voltage. The charge inversion may result in a high electron or hole concentration around the conductive gate depending on the type of epitaxial layer used (e.g., p-type or n-type). A hole is the lack of an electron at a position where one would normally exist. The high concentration of electrons or holes adjacent the conductive gate prevents the spontaneous generation of dark current. The conductive gate therefore provides excellent isolation while preventing high levels of dark current.

Conductive gate 38, sometimes referred to as conductive layer 38, may be made of any suitable material. Conductive layer 38 may, for example, be made of a metal such as tungsten, titanium nitride, or titanium aluminum nitride. Metal materials with midgap or band edge work function may be used in conductive gate 38. In certain embodiments, gate 38 may be made of a doped polysilicon. The polysilicon may be, for example, a p-type polysilicon.

In certain embodiments, liner oxide 36 may be omitted from each isolation region. In these embodiments, metal gate 38 may be disposed in the isolation region in direct contact with epitaxial layer 32. Alternatively, certain isolation regions may include a liner while other isolation regions may not include a liner. Each isolation region may be only partially covered by liner oxide 36. In general, any portion of each isolation region may be optionally covered by liner oxide 36.

The arrangement of FIG. 5 may result in each photodiode having a greater photosensitive area which results in increased full well capacity. Additionally, the metal gate results in increased potential inside the photodiode. This results in a greater probability that electrons generated in a pixel will be collected by that pixel's photodiode. In some cases, an electron will be generated in a pixel but be collected in a neighboring pixel's photodiode. This causes unwanted noise in the image data as the image data is not an accurate reflection of the incident light received by the pixels. However, due to the improved arrangements of FIG. 5, electrons are more likely to be collected in the correct photodiode. This results in increased quantum efficiency in each photodiode. Cross-talk, in which incident light in a pixel is captured in a neighboring pixel, is reduced by the arrangement of FIG. 5. Blooming will also be reduced by the arrangement of FIG. 5.

Any suitable bias voltage may be supplied to metal gate 38. Image sensors such as image sensor 12 may include a power supply line. The power supply line may be used while image data is gathered by the image sensor. For example, a bias voltage ($V_{AAPIX}$) may be applied to the power supply line. The pixel may be electrically connected to the power supply line to reset the pixel. Metal gate 38 may be electrically connected to a bias voltage supply that is separate from the power supply line. The bias voltage may be a negative bias voltage of any suitable value. The bias voltage may be, for example, −1.0 Volts, less than −1.0 Volts, or greater than −1.0 Volts.

Figure 6:
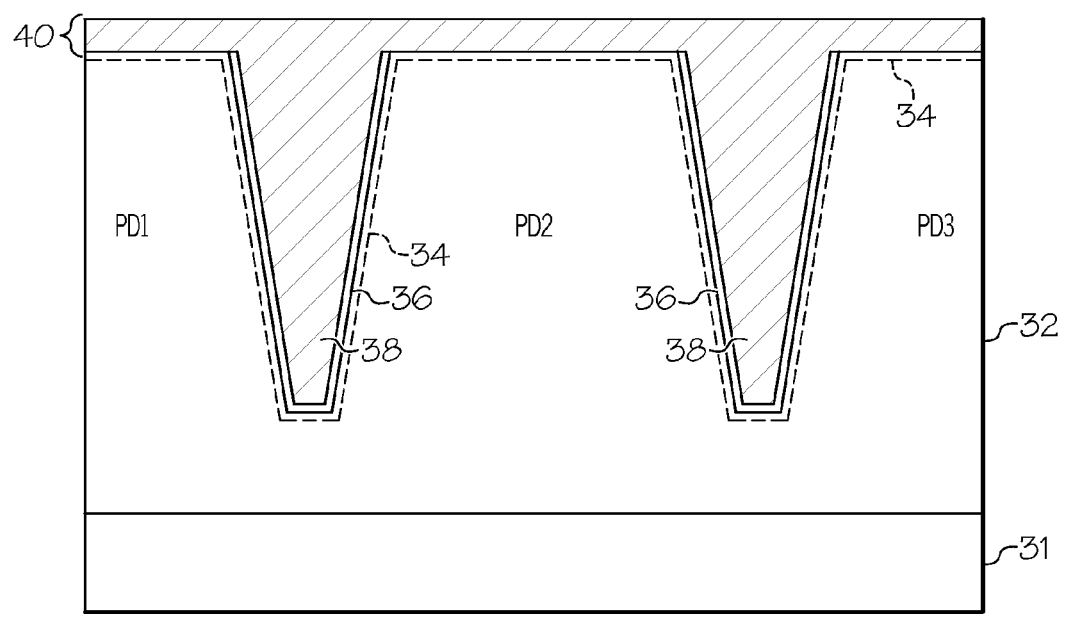
FIG. 6 is a cross-sectional side view of an illustrative image sensor with a connecting layer electrically connecting conductive layers in each isolation region in accordance with an embodiment of the present invention.

Metal gates 38 may be electrically isolated, as shown in FIG. 5. In arrangements where the metal gates are not electrically connected, a contact to the bias voltage supply would be required for each metal gate. Therefore, in order to reduce the complexity of the image sensor, the metal gates may be electrically connected to each other in some embodiments. If each metal gate is electrically connected, then one contact to the bias voltage supply would sufficiently bias each metal gate. FIG. 6 shows an illustrative arrangement of image sensor 12 where each metal gate 38 is electrically connected.

As shown in FIG. 6, a connecting layer 40 may electrically connect each portion of conductive layer 38. Connecting layer 40 may be made of the same material as conductive gates 38. Alternatively, connecting layer 40 may be made of a different material than conductive gates 38. Connecting layer 40 may be any desirable conductive material. Connecting layer 40 may be arranged in a grid to electrically connect the metal gate of each isolation region. In this embodiment, the connecting layer would overlap each metal gate 38 while leaving the regions above each photodiode uncovered. In another possible arrangement, connecting layer 40 may completely cover substrate 32, including the isolation regions and the regions above each photodiode.

FIG. 6 shows liner oxide 36 formed only in the isolation regions and not between connecting layer 40 and substrate 32. This example is purely illustrative, and liner 36 may be included in between any portions of connecting layer 40 and the substrate.

In FIGS. 5 and 6, isolation region 24 is shown as only partially extending through substrate 32. This example is purely illustrative. Isolation regions 24 may extend less than halfway through substrate 32, more than halfway through substrate 32, or completely through substrate 32.

Figure 7:
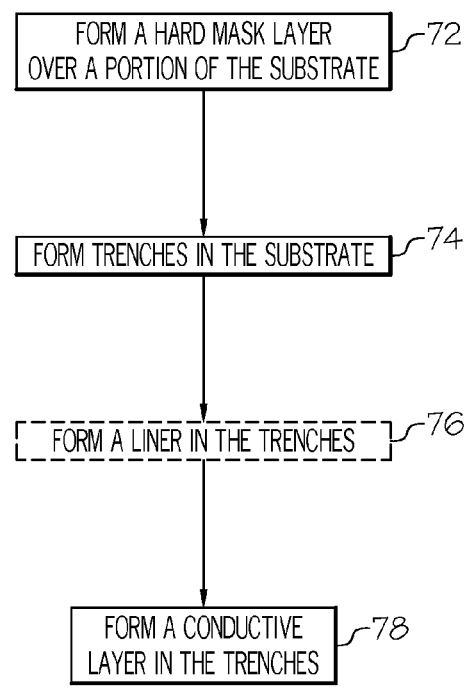
FIG. 7 is a flowchart of illustrative steps for forming an image sensor with conductive layers in each isolation region in accordance with an embodiment of the present invention.

FIG. 7 shows an illustrative method for forming a conductive layer in the isolation regions of an image sensor. At step 72, a hard mask layer may be formed over a portion of substrate 32. The hard mask layer may be formed over each photodiode region. Isolation regions 24 may remain uncovered by the hard mask layer. The segments of the hard mask layer may be separated by 3 micrometers, less than 3 micrometers, less than 1 micrometer, more than 3 micrometers, more than 10 micrometers, or any other suitable distance. The hard mask layer may be formed from silicon nitride, a photoresist, or other suitable mask material.

At step 74, trenches may be formed in substrate 32. The trenches may be formed using an etching process. Etching may occur at each isolation region. This etching may be dry etching or wet etching. In wet etching, epitaxial layer 32 may be immersed in a bath of etchant. The etchant may be buffered hydrofluoric acid, potassium hydroxide, a solution of ethylene diamine and pyrocatechol, or any other suitable etchant. The hard mask layer may be resistant to the etchant. Accordingly, the hard mask layer may prevent epitaxial layer 32 from being etched in the areas directly beneath the hard mask layer. In the areas not covered by the hard mask layer, the silicon etching may form trenches. The dimensions of the trenches may be controlled during the etching process. For example, immersing epitaxial layer 32 in a bath of etchant for a longer period of time may result in a deeper trench. The trenches may be formed with widths of 10 microns or less, 3 microns or less, 1 micron or less, 0.5 microns or less, 0.3 microns or less, etc. It may be desirable to have isolation regions that extend from the surface of a substrate to a depth of, e.g. 3-5 microns, 3 microns or more, 4 microns or more, etc. Desired width vs. height aspect ratios for trench 38 may be, for example, approximately 1:8, 1:7 or greater, 1:8 or greater, 1:9 or greater, etc.

At step 76, a liner may be formed in the trenches. The liner may be an oxide liner such as liner 36 in FIGS. 5 and 6. Liner 36 may be formed using any desired methods (e.g., thermal oxidation). At step 78, a conductive layer may be formed in the trenches. The conductive layer may be metal or a doped polysilicon. The conductive layer may be formed using any desired methods (e.g., chemical vapor deposition). In certain embodiments, step 76 may be omitted. In these embodiments, the conductive layer may be formed in the trenches without an intervening liner. Additionally, the hard mask layer formed in step 72 may be removed after step 74, after step 76, or after step 78.

Figure 8:
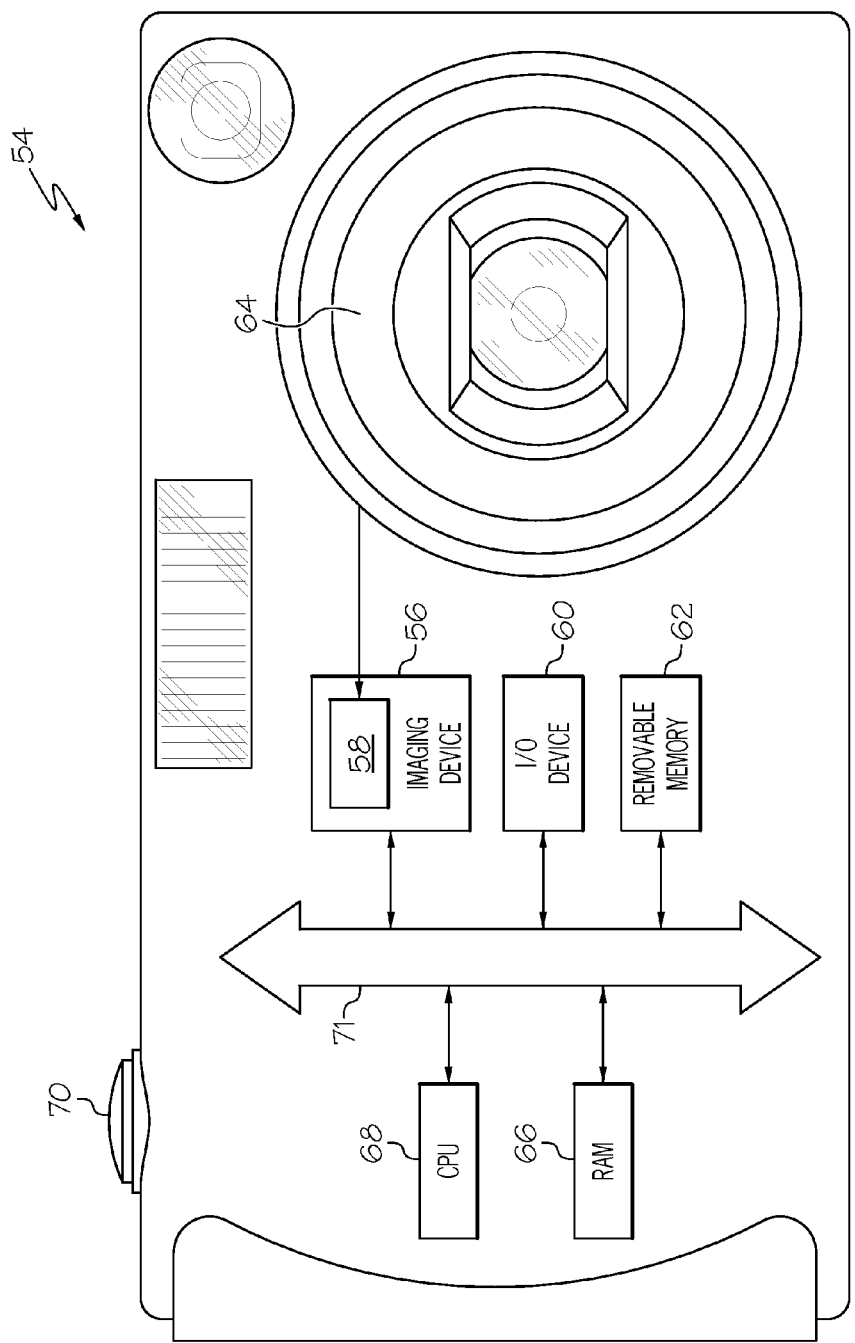
FIG. 8 is a block diagram of an illustrative processor system employing the embodiments of FIGS. 1-7 in accordance with an embodiment of the present invention.

FIG. 8 shows in simplified form a typical processor system 54, such as a digital camera, which includes an imaging device 56. Imaging device 56 may include a pixel array 58 of the type shown in FIG. 2. Pixel array 58 may include isolation regions formed with a conductive layer such as those shown in FIG. 5 or FIG. 6. Processor system 54 is exemplary of a system having digital circuits that may include imaging device 56. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 54, which may be a digital still or video camera system, may include a lens such as lens 64 for focusing an image onto a pixel array such as pixel array 58 when shutter release button 70 is pressed. Processor system 54 may include a central processing unit such as central processing unit (CPU) 68. CPU 68 may be a microprocessor that controls camera functions and one or more image flow functions and communicates with one or more input/output (I/O) devices 60 over a bus such as bus 71. Imaging device 56 may also communicate with CPU 68 over bus 71. System 54 may include random access memory (RAM) 66 and removable memory 62. Removable memory 62 may include flash memory that communicates with CPU 68 over bus 71. Imaging device 56 may be combined with CPU 68, with or without memory storage, on a single integrated circuit or on a different chip. Although bus 71 is illustrated as a single bus, it may be one or more buses or bridges or other communication paths used to interconnect the system components.

In various embodiments of the invention, an image sensor may include a substrate containing an array of photodiodes, a plurality of isolation regions, and a plurality of conductive layers. Each isolation region may be interposed between a pair of adjacent photodiodes in the array of photodiodes. Each conductive layer may be formed in a respective isolation region, and each conductive layer may be electrically connected to a bias voltage supply line.

In certain embodiments, the image sensor may include a plurality of liners. Each liner may be interposed between a respective conductive layer and the substrate. Alternatively, each conductive layer is formed in direct contact with the substrate. Each isolation region may include a trench in the substrate. Each conductive layer may be formed in a respective trench. The substrate may have a top surface, and each conductive layer may have a respective top surface that is parallel to the top surface of the substrate.

The image sensor may include a connecting layer formed over a top surface of the substrate such that the connecting layer is electrically connected to each conductive layer. The connecting layer may be formed from a first material, the conductive layers may be formed from a second material, and the first material may be the same as the second material. Alternatively, the first material may be different than the second material. The substrate may include epitaxial silicon. Each conductive layer may include tungsten, titanium nitride, or titanium aluminum nitride.

In various embodiments of the invention, an image pixel array may include an array of photosensitive areas, a plurality of trenches, and a plurality of metal layers. Each metal layer may be formed in a respective one of the trenches, and each trench may be interposed between a pair of adjacent photosensitive areas in the array of photosensitive areas. A method of gathering image data using the image pixel array may include electrically connecting metal layers to a bias voltage supply line and while electrically connecting each metal layer to the bias voltage supply line, gathering image data using each photosensitive area in the array of photosensitive areas.

At least two metal layers may be electrically isolated. Electrically connecting each metal layer to the bias voltage supply line may include electrically connecting the at least two metal layers to the bias voltage supply line with at least two contact areas.

At least two metal layers may be electrically connected. Electrically connecting each metal layer to the bias voltage supply line may include electrically connecting the at least two metal layers to the bias voltage supply line with a single contact area.

In various embodiments, a method of forming an image sensor with an array of photodiodes in a substrate and a plurality of isolation regions that isolate each photodiode in the array of photodiodes may include forming a plurality of trenches in the substrate, forming a plurality of liners, and forming a plurality of conductive layers. Each liner may be formed in a respective one of the trenches. Each conductive layer may be formed in a respective one of the trenches.

Forming the plurality of liners may include forming the plurality of liners directly adjacent to the substrate. Forming the plurality of conductive layers may include forming the plurality of conductive layers directly adjacent to the plurality of liners. Before forming the plurality of trenches in the substrate, a hard mask may be formed over at least a portion of the substrate. Forming the plurality of trenches in the substrate may include performing an etching process, and the hard mask layer may be resistant to the etching process.

The substrate may have a top surface and each conductive layer may have a respective top surface. The method may further include forming a planar connecting layer that contacts both the top surface of the substrate and the top surfaces of the conductive layers. Forming the plurality of liners may include forming liners on the top surface of the substrate.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
   a substrate containing an array of photodiodes, wherein the substrate has a top surface;
   a plurality of isolation regions, wherein each isolation region is interposed between a pair of adjacent photodiodes in the array of photodiodes; and
   a plurality of conductive layers, wherein each conductive layer is formed in a respective isolation region, wherein each conductive layer is electrically connected to a bias voltage supply line, wherein each isolation region comprises a trench in the substrate, wherein each conductive layer is formed in a respective trench, wherein each conductive layer has at least a portion formed below the top surface of the substrate, and wherein each conductive layer is formed in direct contact with the substrate without an intervening liner.

2. The image sensor defined in claim 1, wherein the top surface of the substrate is formed in a first plane, wherein each conductive layer has a respective top surface formed in the first plane that is parallel to the top surface of the substrate.

3. The image sensor defined in claim 1, further comprising a connecting layer formed over the top surface of the substrate such that the connecting layer is electrically connected to each conductive layer.

4. The image sensor defined in claim 3, wherein the connecting layer is formed from a first material, wherein the conductive layers are formed from a second material, and wherein the first material is the same as the second material.

5. The image sensor defined in claim 3, wherein the connecting layer is formed from a first material, wherein the conductive layers are formed from a second material, and wherein the first material is different than the second material.

6. The image sensor defined in claim 1, wherein the substrate comprises epitaxial silicon.

7. The image sensor defined in claim 1, wherein each conductive layer comprises a material selected from the group consisting of: tungsten, titanium nitride, and titanium aluminum nitride.

8. The image sensor defined in claim 1, wherein each conductive layer is formed entirely below the top surface of the substrate.

9. The image sensor defined in claim 3, wherein every photodiode in the image sensor is completely surrounded by the plurality of conductive layers.

10. An image sensor comprising:
    a substrate containing an array of photodiodes, wherein the substrate has a top surface and a bottom surface;
    a plurality of trenches, wherein each trench is interposed between a pair of adjacent photodiodes in the array of photodiodes, and wherein each trench extends from the top surface of the substrate towards the bottom surface of the substrate;
    a plurality of conductive layers, wherein each conductive layer is formed in a respective trench, wherein each conductive layer is electrically connected to a bias voltage supply line, and wherein each conductive layer has at least a portion formed below the top surface of the substrate; and
    a connecting layer formed over the top surface of the substrate such that the connecting layer is in direct contact with each conductive layer.

11. The image sensor defined in claim 10, further comprising a plurality of liners, wherein each liner is interposed between a respective conductive layer and the substrate.

12. The image sensor defined in claim 10, wherein each conductive layer is formed in direct contact with the substrate.

13. The image sensor defined in claim 10, wherein each conductive layer comprises a material selected from the group consisting of: tungsten, titanium nitride, and titanium aluminum nitride.

14. The image sensor defined in claim 10, wherein the plurality of conductive layers prevent cross-talk between adjacent photodiodes.

15. The image sensor defined in claim 10, wherein the connecting layer is formed from a first material, wherein the conductive layers are formed from a second material, and wherein the first material is the same as the second material.

16. The image sensor defined in claim 10, wherein the connecting layer is formed from a first material, wherein the conductive layers are formed from a second material, and wherein the first material is different than the second material.

17. The image sensor defined in claim 10, wherein the connecting layer is arranged in a grid and wherein the connecting layer overlaps each conductive layer while leaving the array of photodiodes uncovered.

18. The image sensor defined in claim 10, wherein the connecting layer completely covers each conductive layer and the array of photodiodes.

* * * * *